United States Patent
Rao et al.

(10) Patent No.: US 8,666,346 B1
(45) Date of Patent: Mar. 4, 2014

(54) ROBUST FM MODULATION DETECTOR USING SIGNAL AUTOCORRELATION

(75) Inventors: Sira Parasurama Rao, Sugarland, TX (US); John Elliott Whitecar, Plymouth, MI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/594,506

(22) Filed: Aug. 24, 2012

(51) Int. Cl.
*H04B 1/16* (2006.01)

(52) U.S. Cl.
USPC ......... 455/266; 455/254; 455/307; 455/226.1

(58) Field of Classification Search
USPC .............. 455/205, 214, 226.1, 254, 266, 296, 455/339, 340
See application file for complete search history.

(56) References Cited

U.S. PATENT DOCUMENTS

| | | | | |
|---|---|---|---|---|
| 3,281,698 A | * | 10/1966 | Rose, Jr. et al. | 455/263 |
| 5,475,871 A | * | 12/1995 | Shalev et al. | 455/70 |
| 5,691,666 A | * | 11/1997 | Owen | 329/319 |
| 6,122,496 A | * | 9/2000 | Yoshioka | 455/307 |
| 8,095,095 B2 | * | 1/2012 | Saito et al. | 455/130 |

* cited by examiner

*Primary Examiner* — Blane J Jackson
(74) *Attorney, Agent, or Firm* — Robert D. Marshall, Jr.; W. James Brady; Frederick J. Telecky, Jr.

(57) ABSTRACT

An FM receiver is unaware of the modulation level (frequency deviation) of the signal and has to make an estimate of it, or some reasonable time-average of it, and accordingly set the input filter's bandwidth. We calculate modulation by measuring the autocorrelation of the recovered audio signal instead of its peaks, and then applying a peakhold detector. Since FM noise can be modeled to be somewhat uncorrelated, we can expect to get an accurate estimate of signal power while rejecting noise power substantially if we measure a one-sample delayed autocorrelation estimate. Since the above measurement is alike a power measurement, we compute its square root, gain adjust it to obtain a cleaner peak measurement, and then track these clean peaks using a leaky integrator. This gives an estimate of modulation that subdues the effect of the noise.

6 Claims, 2 Drawing Sheets

ROBUST FM MODULATION DETECTOR USING SIGNAL AUTOCORRELATION

TECHNICAL FIELD OF THE INVENTION

The technical field of this invention is frequency modulated radio communication.

BACKGROUND OF THE INVENTION

In electronics and telecommunications, modulation is the process of varying one or more properties of a high-frequency periodic waveform, called the carrier signal, with a modulating signal which typically contains information to be transmitted. The three key parameters of a periodic waveform are its amplitude, its phase and its frequency. Any of these properties can be modified in accordance with a low frequency signal to obtain the modulated signal. Typically a high-frequency sinusoid waveform is used as carrier signal, but a square wave pulse train may also be used.

The purpose of modulation is to convey a message signal, for example a digital bit stream or an analog audio signal, inside another signal that can be physically transmitted. Modulation of a sine waveform is used to transform a baseband message signal into a passband signal, for example low-frequency audio signal into a radio-frequency signal (RF signal). In radio communications, cable TV systems or the public switched telephone network for instance, electrical signals can only be transferred over a limited frequency spectrum, with specific (non-zero) lower and upper cutoff frequencies. Modulating a sine-wave carrier makes it possible to keep the frequency content of the transferred signal as close as possible to the centre frequency (typically the carrier frequency) of the passband.

FIG. 1 shows the waveforms resulting from Amplitude Modulation (AM) and Frequency Modulation (FM) of a carrier where 101 is the low frequency modulating signal, 102 is the amplitude modulated carrier and 103 shows the frequency modulated carrier.

Most FM broadcast stations transmit stereo signals, however it is important that the stereo broadcasts be compatible with mono receivers. For this reason as shown on FIG. 2, the left (L) and right (R) audio channels are algebraically encoded into sum (L+R) and difference (L−R) signals. A mono receiver will use just the L+R signal so the listener will hear both channels through the single loudspeaker. A stereo receiver will add the difference signal to the sum signal to recover the left channel, and subtract the difference signal from the sum to recover the right channel.

The (L+R) main channel signal is transmitted as baseband audio 201 in the range of 30 Hz to 15 kHz. The (L−R) signal is modulated onto a 38 kHz double-sideband suppressed carrier (DSBSC) signal 202 and 203 occupying the baseband range of 23 to 53 kHz.

A 19 kHz pilot tone 204, at exactly half the 38 kHz subcarrier frequency and with a precise phase relationship to it is also generated. This is transmitted at 8-10% of overall modulation level and used by the receiver to regenerate the 38 kHz sub-carrier with the correct phase.

The final multiplex (Mpx) signal from the stereo generator contains the Main Channel (L+R), the pilot tone, and the sub-channel (L−R). This composite signal, along with any other sub-carriers, modulates the FM transmitter.

Content transmitted by FM stations may have varying frequency deviation from the nominal carrier frequency depending on the transmission bandwidth the station uses, and the instantaneous bandwidth of the message signal that is modulating the FM carrier. In order to minimize distortion, the bandwidth employed must be wide enough to accommodate maximum frequency deviation allowed by the particular station.

An FM receiver is unaware of the frequency deviation and has to make an estimate of it, or some reasonable time-average of it, and accordingly set the input filter's bandwidth. If the input filter's bandwidth is narrower than the required bandwidth, it will lead to distortion because necessary portions of the message spectrum have been clipped off. If the input's filter bandwidth is much wider than the required bandwidth, it may not harm performance if the RF signal level is strong. However, if the RF signal level is weak, it will contribute to additional noise and thus degrade performance. By setting the input filter's bandwidth to just the necessary bandwidth, the receiver will maximize performance both in terms of Signal-to-Noise Ratio (SNR) and Signal-to-Noise-And-Distortion (SINAD). Thus, receivers try to be frequency deviation "followers".

In the receiver, a parameter called Modulation is a measure of the frequency deviation, using which a radio receiver estimates what bandwidth of the input signal must be used for decoding and recovering the message signal.

Estimation of modulation is a difficult problem. The estimation is particularly hard when the RF signal level is weak, and when noise corrupts the signal. Typically, modulation can be measured by looking at the peaks of the recovered (modulating) signal. However, under weak signal conditions, signal peaks get blanketed by noise peaks, so the peak-based approach overestimates the frequency deviation, thereby leading to a wider input filter than necessary and thus hurting SNR and SINAD.

SUMMARY OF THE INVENTION

Modulation is calculated by measuring the autocorrelation of the recovered audio signal (the left channel and or the right channel), instead of its peaks, and then applying a peak hold detector. Since FM noise tends to be somewhat uncorrelated, this will result in a more accurate estimate of signal power while rejecting noise power substantially. Since the above measurement is similar to a power measurement, we compute its square root, adjust the gain to obtain a cleaner peak measurement, and then track these clean peaks using a leaky integrator. This gives an estimate of modulation while minimizing the effect of the noise.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
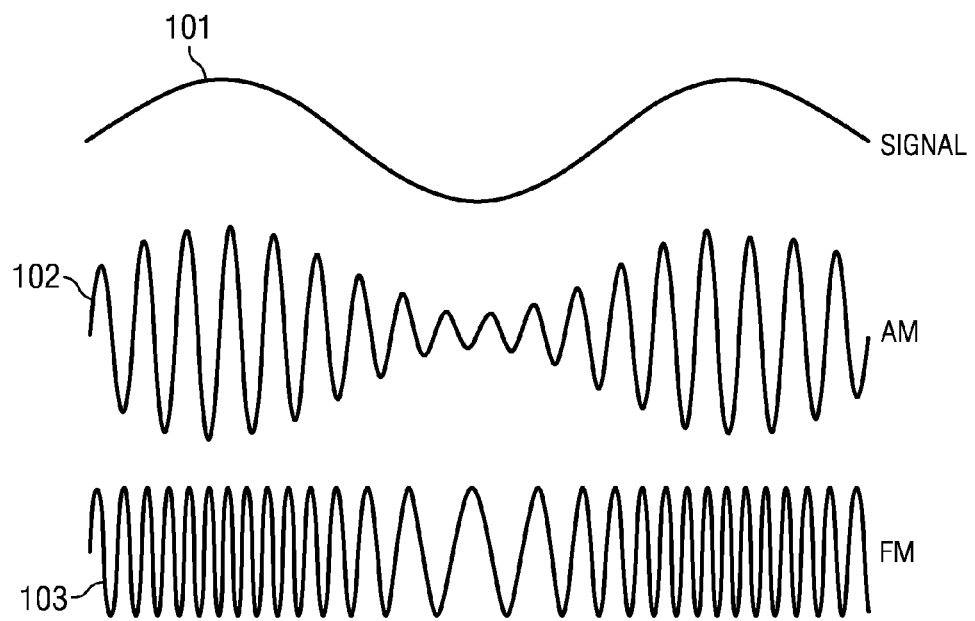
FIG. 1 shows the waveforms resulting from AM and FM modulation.
Figure 2:
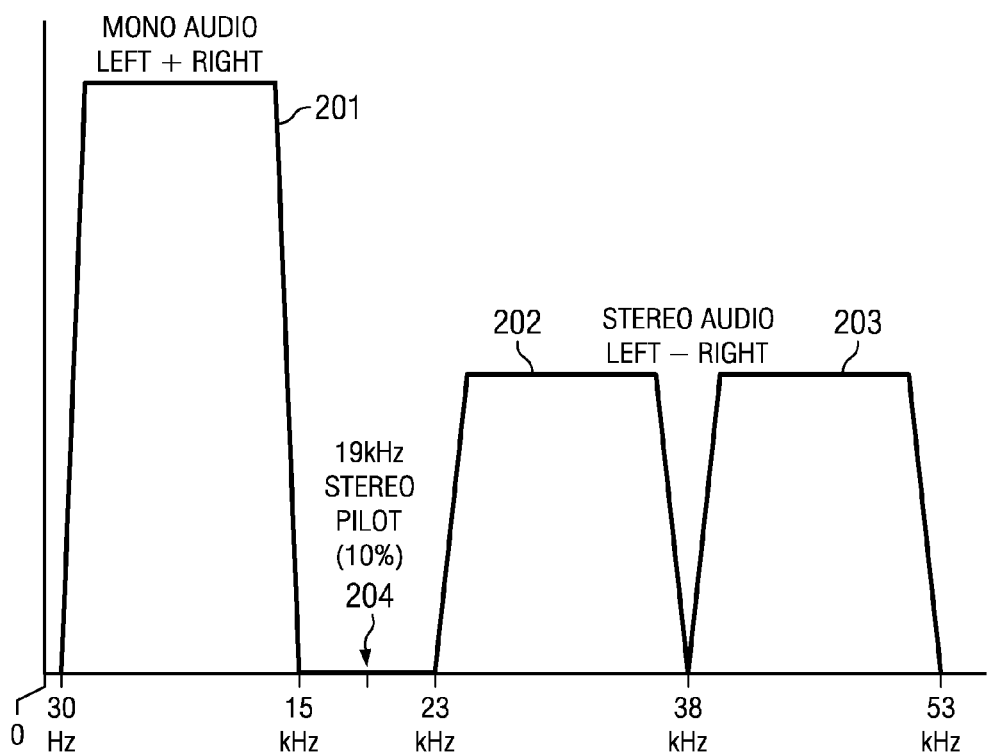
FIG. 2 shows the spectrum utilization of FM stereo modulation.
Figure 3:
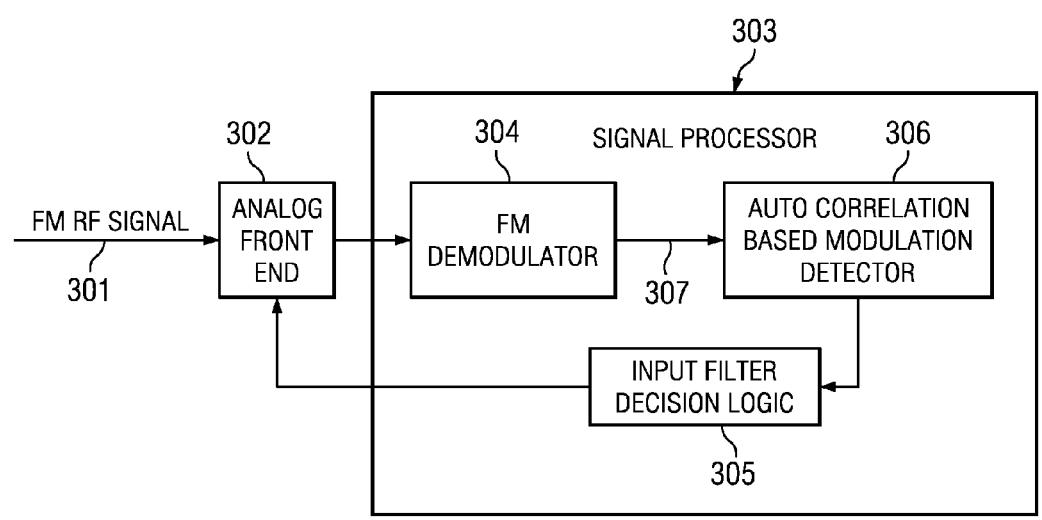
FIG. 3 shows a block diagram of an auto correlation based modulation detector.

In the implementation shown in FIG. 3 the input to the system is the FM Radio Frequency (RF) signal 301, which feeds an Analog Front End (AFE) 302, that extracts the desired FM signal by filtering the appropriate portion of the frequency spectrum. The AFE also down converts the RF signal to a baseband signal, and performs Analog-to-Digital conversion. Thus, In phase-Quadrature phase (IQ) baseband samples are generated for the signal processor 303. The signal processor consists of an FM demodulator 304 implemented in software, where the output of the demodulator is the recovered audio signal. This is the input to the autocorrelation based modulation detector 306. The output of this block is the estimated modulation, which is used by the input filter decision logic 305 to convey the desired input filter to the AFE.

In the embodiment described the recovered audio signal 307 is the input to the autocorrelation calculation performed in block 306, as shown in the following equation:

$$Rxx(1) = \text{Gain} \times \sqrt{\left(\frac{1}{N}\sum_{n=0}^{n=N-1} Mpx(n) \times Mpx(n-1)\right)}$$

where Rxx(1) is the one sample delayed autocorrelation estimate. Since this is essentially a power measurement, a square root function is applied to convert the measurement from energy to a level measurement. A gain term is applied to obtain a cleaner measurement and for calibration purposes. n is the block period duration over which the autocorrelation function is computed, with a 10 ms block period in this implementation although the period is not restricted to any particular value, and Mpx is the level of the recovered audio signal.

The peaks so computed are then tracked by using a leaky integrator with different attack and decay time constants $$H(z) = \frac{b}{1-(1-b)z^{-1}}$$

$$b = b\_attack, \text{ if } x(n) > y(n-1)$$

$$b = b\_decay, \text{ if } x(n) <= y(n-1)$$

where H(z) is the first order leaky integrator filter response, whose output is the estimated modulation.

Using the modulation estimate a look up table is used to select the appropriate input filter. In this embodiment, a 16 band input filter is used, consisting of filters with increasing bandwidths, with the narrowest filter having a bandwidth of 30 kHz and the widest having a bandwidth of 150 kHz. The 16 filter bandwidths are as follows:
1=30 kHz
2=33.39 kHz
3=37.18 kHz
4=41.39 kHz
5=46.08 kHz
6=51.30 kHz
7=57.11 kHz
8=63.58 kHz
9=70.78 kHz
10=78.79 kHz
11=87.72 kHz
12=97.66 kHz
13=108.72 kHz
14=121.03 kHz
15=134.73 kHz
16=150 kHz
The maximum modulation that each filter can handle is shown below:
1=30 kHz
2=33.39 kHz
3=37.18 kHz
4=41.39 kHz
5=46.08 kHz
6=51.30 kHz
7=57.11 kHz
8=63.58 kHz
9=70.78 kHz
10=78.79 kHz
11=87.72 kHz
12=97.66 kHz
13=108.72 kHz
14=121.03 kHz
15=134.73 kHz
16=150 kHz FM stations can achieve a peak frequency deviation of 150 kHz, giving a practical range of deviation to be 0-150 kHz. In this embodiment, the gains and signal levels are calibrated to measure 100% modulation at 150 kHz. As an example if an FM carrier is modulated so that the frequency deviation is 22.5 kHz, the correct modulation estimate is 15%. The filter closest to a bandwidth of 22.5 kHz is filter 1, and this will be selected as the optimal filter by the filter decision logic 305.

The embodiment described may be modified a number of ways, and is not meant to be restrictive in any way. As an example the autocorrelation computation may be applied at different points in the receiver signal chain—on the stereo Mpx signal, on the left channel signal before deemphasis, on the left channel signal post deemphasis, or on the right channel signal. Rxx(2) may be used instead of Rxx(1) to get better noise rejection, while considering the trade offs involved. With Rxx(2) the modulation estimate may be lower, but the noise rejection may improve.

In the implementation shown, a block of audio signal consisting of about 10 ms of audio is used to generate one autocorrelation sample, followed by another non overlapping block to generate the next autocorrelation sample. Alternatively overlapping blocks of audio may be used for a better estimate of autocorrelation at the expense of increasing the computational load on the processor.

A down sampled autocorrelation function may be used to reduce the required computational load, at the expense of the accuracy of the modulation estimate.

A flexible single order integrator is shown, however a higher order integrator may also be used if a better average is required. This will increase the computational load required on the processor.

What is claimed is:

1. A method of estimating the modulation of a frequency modulated signal comprising the steps of:
    applying an adjustable bandwidth filter to said frequency modulated signal;
    demodulating said filtered signal to recover baseband audio;
    applying an autocorrelation function to said audio signal;
    applying a leaky integrator with unequal attack and decay times to the result of the autocorrelation function resulting in an estimate of the signal's modulation;
    adjusting the bandwidth of said adjustable bandwidth filter to the optimum bandwidth indicated by the estimated modulation.

2. The method of claim 1 wherein:
    the autocorrelation function is defined by the following equation where Mpx represents the audio signal, and n represents the length of the block of audio over which the autocorrelation function is computed:

$$Rxx(1) = \text{Gain} \times \sqrt{\left(\frac{1}{N}\sum_{n=0}^{n=N-1} Mpx(n) \times Mpx(n-1)\right)}.$$

3. The method of claim 1 where:
    the audio blocks employed to calculate the autocorrelation function are consecutive.

4. The method of claim 1 where:
the audio blocks employed to calculate the autocorrelation function are overlapping.

5. The method of claim 1 wherein:
the integrator function is defined by the following equation:

$$H(z) = \frac{b}{1-(1-b)z^{-1}}$$

$$b = b\_attack, \text{ if } x(n) > y(n-1)$$

$$b = b\_decay, \text{ if } x(n) <= y(n-1)$$

where H is the first order leaky integrator response whose output is the estimated modulation.

6. A method of estimating the modulation of a frequency modulated signal further comprising the steps of:
applying one of a plurality of bandwidth filters to said frequency modulated signal;
demodulating said filtered signal to recover baseband audio;
applying an autocorrelation function to said audio signal;
applying a leaky integrator with unequal attack and decay times to the result of the autocorrelation function resulting in an estimate of the signal's modulation;
selecting appropriate bandwidth filter having the optimum bandwidth as indicated by the estimated modulation.

\* \* \* \* \*